(12) United States Patent
Marbot et al.

(10) Patent No.: US 6,208,182 B1
(45) Date of Patent: Mar. 27, 2001

(54) PHASE-LOCKED LOOP CIRCUIT

(75) Inventors: Roland Marbot, Sassenage; Guillaume Couzon, Grenoble, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/184,224

(22) Filed: Nov. 2, 1998

(30) Foreign Application Priority Data

Nov. 3, 1997 (FR) ........................................... 97 13992

(51) Int. Cl.$^7$ ............................................. H03L 7/06
(52) U.S. Cl. .................. 327/158; 327/156; 327/159; 327/261
(58) Field of Search ................... 327/156, 158, 327/159, 261, 263, 270, 271, 277, 284

(56) References Cited

U.S. PATENT DOCUMENTS

| 4,244,043 | * | 1/1981 | Fujita | 368/85 |
| 5,260,608 | | 11/1993 | Marbot | 327/261 |
| 5,548,235 | | 8/1996 | Marbot | 327/158 |
| 5,550,515 | * | 8/1996 | Liang | 331/11 |
| 5,633,899 | | 5/1997 | Fiedler et al. | 375/376 |
| 5,684,805 | | 11/1997 | Brown | 370/518 |

OTHER PUBLICATIONS

Lee, I., et al.: "A 622MB/S CMOS Clock Recovery PLL With Time–Interleave Phase Detector Array" IEEE International Solid State Circuits Conference, vol. 39, Feb. 1996, pp 198–199.

* cited by examiner

Primary Examiner—Kenneth B. Wells
Assistant Examiner—Cassandra Cox
(74) Attorney, Agent, or Firm—Wolf, Greenfield & Sacks, P.C.; James H. Morris; Theodore E. Galanthay

(57) ABSTRACT

The present invention relates to a phase-locked loop circuit including: a programmable ring oscillator generating drive signals, an assembly of latches receiving an input signal of the circuit, the latches being driven by the drive signals and generating samples by sampling of the input signal, and a logic decoding circuit receiving samples generated by latches and accordingly driving the oscillator.

7 Claims, 3 Drawing Sheets

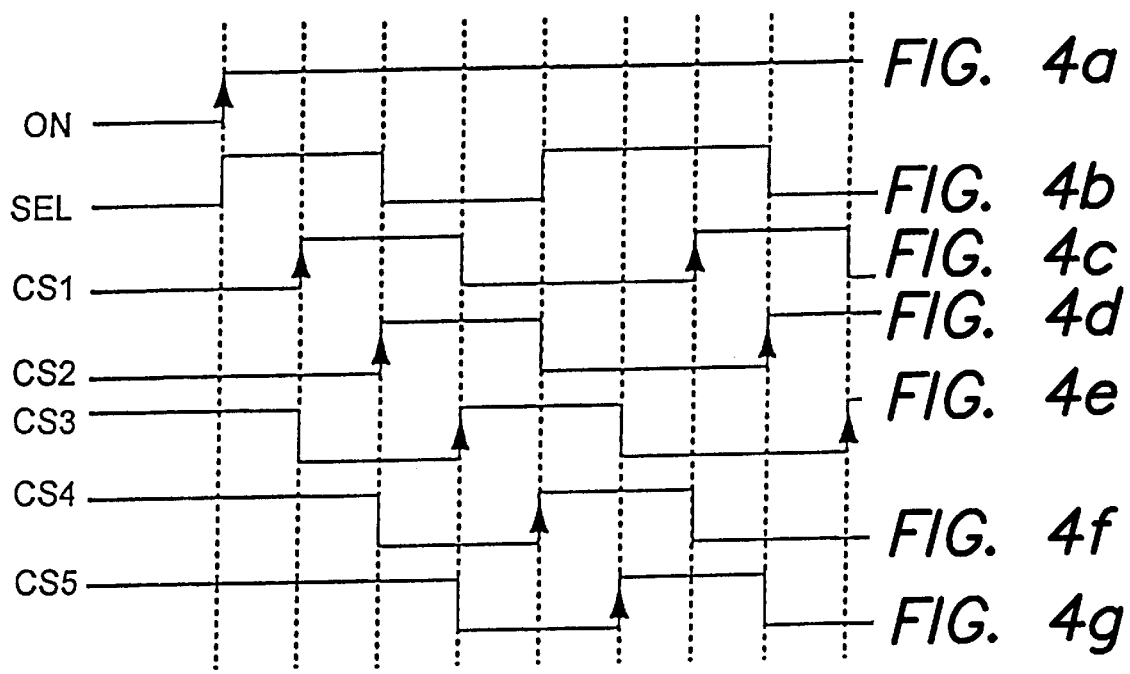
FIG. 4a
FIG. 4b
FIG. 4c
FIG. 4d
FIG. 4e
FIG. 4f
FIG. 4g
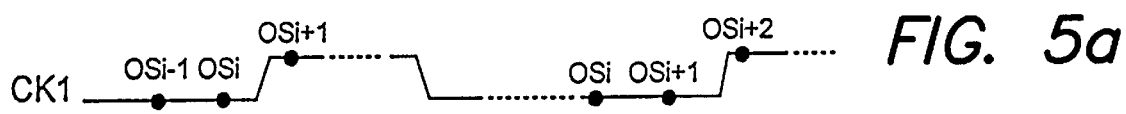
FIG. 5a
FIG. 5b
FIG. 5c

PHASE-LOCKED LOOP CIRCUIT

BACKGROUND OF THE INVENTION

1. Field of the Invention

The present invention relates to a phase-locked circuit.

2. Discussion of the Related Art

A phase-locked loop circuit, as illustrated in FIG. 1, includes a phase comparator 2 receiving an input signal IS and a feedback signal FBS, a filter 3 receiving an output signal CS from phase comparator 2, and a voltage-controlled oscillator (VCO) 4, which receives an output signal FS from filter 3 and provides an output signal OS of PLL 1 and controls a feedback loop to generate the feedback signal provided to phase comparator 2. The feedback loop can be, for example, a frequency divider 5 receiving output signal OS and generating feedback signal FBS.

An application of PLLs is in the implementation of low jitter oscillators for providing clock signals of accurate frequency and low jitter.

To provide such a clock signal, a quartz crystal oscillator is conventionally used. To generate a clock signal of given frequency, a quartz crystal oscillator, the natural frequency of which corresponds to the desired frequency, can be used. This solution is generally acceptable for frequencies up to 25 megahertz. However, obtaining higher frequencies, for example on the order of one hundred megahertz, presents problems, either because there is no quartz crystal oscillator that operates at the desired frequency, or because such a quartz crystal oscillator is expensive. It is thus generally preferred to use oscillators including an inexpensive quartz crystal of low frequency, for example, of 25 megahertz, and a frequency multiplier made from a PLL.

In practice, PLLs having a rather low jitter, for example, on the order of 150 picoseconds, can be found. A problem is that such a jitter, even though it is low, can be too high in some applications. Such is the case in high rate series links, illustrated for example in U.S. Pat. Nos. 5,268,937, 5,414,830, and 5,430,773, in which several 100-megahertz phase-shifted clock signals are used to drive the series transmission or reception at a higher frequency, for example, on the order of 1 gigahertz. It is then desired to obtain a jitter limited to a few tens of picoseconds, which is not possible with conventional PLLs.

SUMMARY OF THE INVENTION

An object of the present invention is to provide a phase-locked loop circuit having less sensitivity to jitter.

Thus, the present invention provides a phase-locked loop circuit including a programmable ring oscillator generating drive signals; an assembly of latches receiving an input signal of the circuit, the latches being driven by the drive signals and generating samples by sampling the input signal; a logic decoding circuit receiving samples generated by latches and accordingly driving the programmable ring oscillator.

According to an embodiment, the decoding circuit includes means for comparing samples two by two to determine whether a state transition has occurred in a time interval separating the two samples, this comparison being performed over at least two cycles, consecutive or not, of the ring oscillator, so that:

if, during the second cycle, a comparable state transition is detected in the same interval, the control of the programmable ring oscillator is not modified, if, during the second cycle, a comparable state transition is detected in a subsequent interval, a decrease of the programmable ring oscillator period is ordered, if, during the second cycle, a comparable state transition is detected in a prior interval, an increase of the programmable ring oscillator period is ordered.

According to an embodiment, the programmable ring oscillator is formed of an assembly of programmable elements assembled in a loop, and modification of the oscillator control, when an increase or a decrease of its period is ordered, is performed on one of the programmable elements of the oscillator.

According to an embodiment, the control of the programmable ring oscillator is gradually modified, by increasing and/or decreasing its period once every M periods, with M being an integer.

According to an embodiment, the programmable ring oscillator is formed of programmable delay elements assembled in a loop.

According to an embodiment, the delay elements are non-inverting and the programmable ring oscillator includes means for modifying the state of an input signal of the first delay element, to enable oscillation of all delay elements.

According to an embodiment, the programmable ring oscillator includes multiplexing means arranged so that an input of the first delay element is connected to an output of the last element or receives a permanent logic state, the multiplexing means being controlled by a drive signal generated on an output of one of the delay elements.

According to an embodiment, the drive signals are combined in a logic adder to generate an output signal of a frequency multiple of the frequency of the programmable ring oscillator.

The foregoing objects, features and advantages of the present invention will be discussed in detail in the following non-limiting description of specific embodiments made in connection with the accompanying drawings.

BRIEF DESCRIPTION OF THE DRAWINGS

FIGS. 4a to 4g are timing diagrams illustrating the operation of the oscillator of FIG. 2, FIGS. 5a to 5c show timing diagrams illustrating the operation of the circuit according to the present invention.

DETAILED DESCRIPTION

Figure 3:
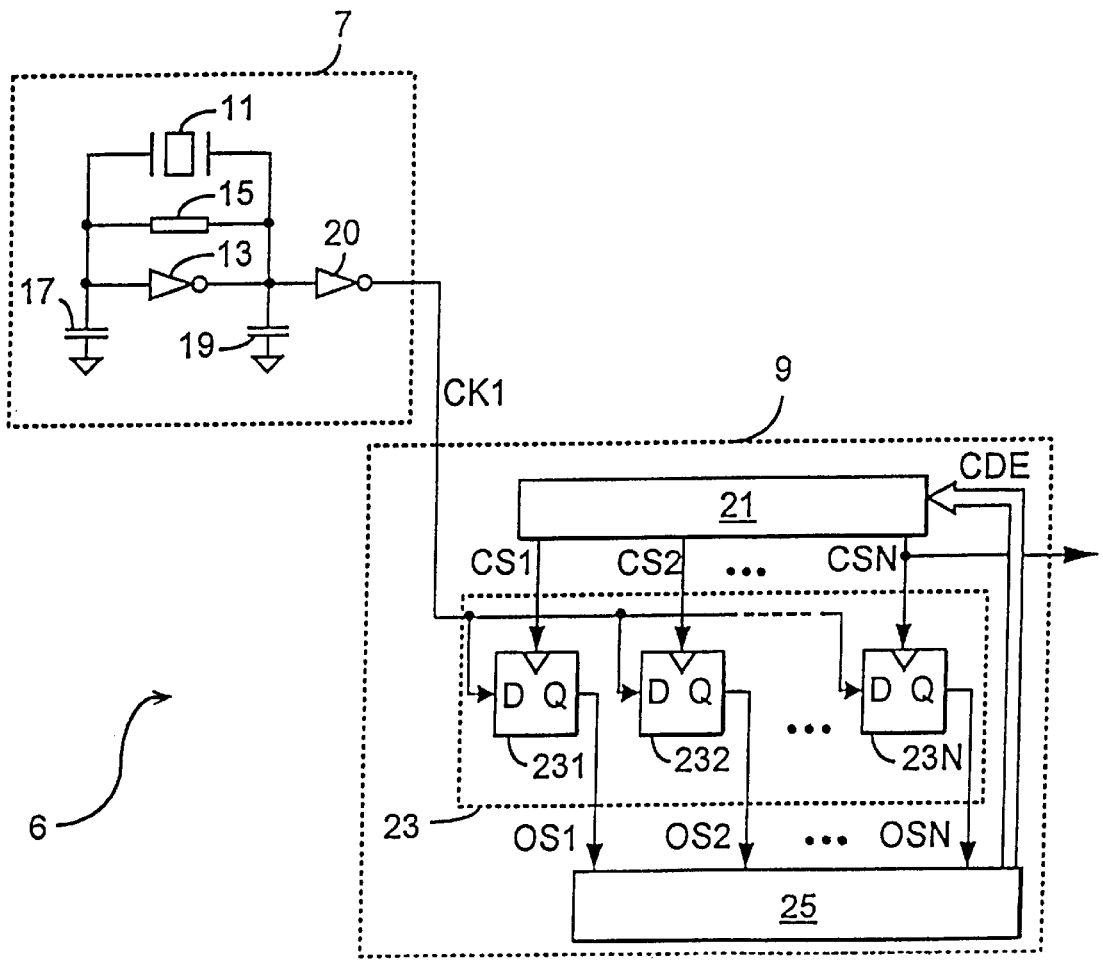
FIG. 3 illustrates an oscillator including a phase-locked loop circuit according to the present invention.

As an example, a typical application of a phase-locked loop circuit, which is the implementation of an oscillator 6, illustrated in FIG. 3, providing a low jitter clock signal CSN from a quartz crystal oscillator, will be considered. It will be assumed that the frequency of clock signal CSN is equal to the frequency of the signal generated from the quartz crystal oscillator. As will be seen, the phase-locked circuit can be used as a multiplier of the frequency of the signal originally generated by the quartz crystal oscillator.

1—Oscillator structure.

Oscillator 6 includes a first oscillator 7, which can be called the basic oscillator. Basic oscillator 7 provides a first clock signal CK1 to a phase-locked loop circuit 9 according to the present invention, the latter receiving as an input the first clock signal and generating a second low jitter clock signal CSN.

1.1—Low frequency oscillator.

Basic oscillator 7 includes a quartz crystal 11 and an inverter 13, of CMOS type, biased in its inversion area and fedback by resistive element 15. Resistive feedback element 15 can be a resistor or a transistor biased in its resistive operation area. The input and the output of inverter 13 are connected across quartz crystal 11. The inverter-resistive element assembly behaves as a negative resistor which enables oscillation. If the oscillation conditions are desired to be optimized, two capacitive elements 17 and 19 can be placed between the inverter input and output and a ground, the capacitive elements having capacitances substantially equal to each other and to the value of the quartz crystal capacitance.

The first clock signal CK1 is generated by an inverter 20, of CMOS type, the input of which is connected to the output of inverter 13. Inverter 20 enables, typically, to setup the clock signal and, more specifically, to generate a clock signal with steep edges.

1.2—Phase-locked loop circuit.

The first clock signal CK1 is provided to phase-locked loop circuit 9.

The phase-locked loop circuit includes:

a programmable ring oscillator 21, to generate N phase-shifted drive signals CS1, CS2, . . . CSN, of the same frequency, to drive the sampling of the first clock signal CK1;

an assembly 23 of N latches 231, 232, . . . 23N receiving the first clock signal CK1 on their D input, these latches being driven by drive signals CS1, CS2, . . . CSN and generating samples OS1, OS2, . . . OSN on their Q output, by sampling of signal CK1. It will be assumed that these latches are responsive to rising edges in the drive signals;

a phase control loop including a logic decoding circuit 25 receiving all or part of samples OS1, OS2, . . . OSN generated by the latches and providing to the ring oscillator control signals CDE to accordingly drive this oscillator, to obtain the frequency desired for the second clock signal CSN.

Before describing the operation of the phase-locked loop circuit according to the present invention in further detail, a programmable ring oscillator structure will be described.

1.3—Programmable ring oscillator.

Figure 1:
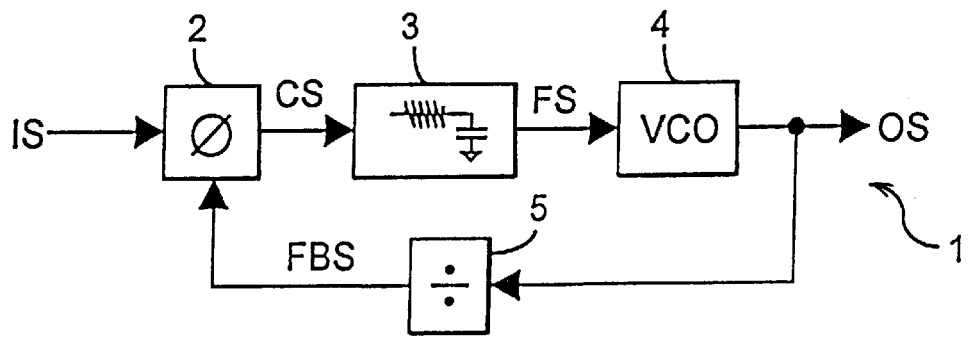
FIG. 1 illustrates a conventional phase-locked loop circuit.
Figure 2:
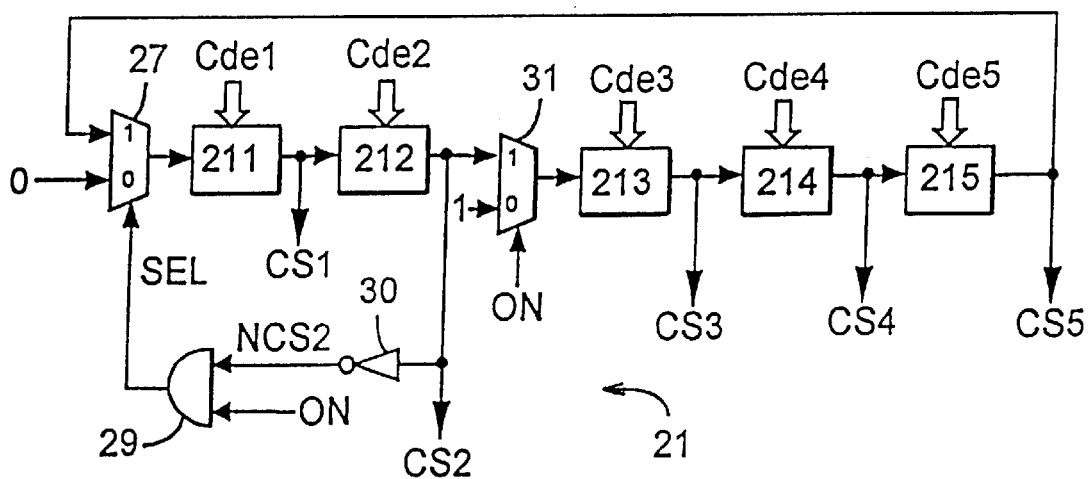
FIG. 2 illustrates a ring oscillator formed of non-inverting delay elements.

FIG. 2 illustrates an example of implementation of programmable ring oscillator 21.

It includes an assembly of N programmable non-inverting delay elements 211, 212, . . . 215 in series, assembled in a loop. The delay elements generate drive signals CS1, CS2, . . . CS5 used to sample the first clock signal CK1 in the circuit latches. In the illustrated example, N=5 has been chosen. A higher or lower number of elements could of course be used, according to the desired application. Each element receives one or several control signals Cde1, Cde2, . . . , Cde5 that vary the duration of the delay of the element. The delay elements will not be described in detail, this type of circuit being known by those skilled in the art. One could refer, for example, to French patents 2690022 and 2689339.

The use of non-inverting elements enables, as will be seen, not to have to consider the propagation time differences of the rising edges and of the falling edges in the ring oscillator. This specificity is particularly advantageous in the context of the applications of high rate series links, described in the above-mentioned US patents. It allows generation of, at the output of the delay elements, signals dividing the oscillator period into equal intervals.

To enable an oscillation of all N elements, the ring oscillator includes means for modifying the state of the input signal of the first delay element. As will be seen, the oscillator more specifically includes multiplexing means arranged so that an input of the first delay element receives a permanent logic state or is connected to an output of the last delay element. One of the drive signals generated by the delay elements is used to modify the input state of the first delay element 211 of the ring oscillator. The index of the delay element generating the signal used to modify the input state of the first delay element 211 is noted R, with of course R<N. In the example illustrated, R=2.

Each of delay elements 21N generates drive signal CSN and receives as an input the output signal generated by the preceding delay element. The first delay element 211 receives drive signal CS5 generated by the last delay element 215, via a multiplexer 27 including two inputs. Multiplexer 27 receives on its inputs drive signal CS5 and a logic state "0". It receives a logic selection signal SEL on a selection input. When selection signal SEL is in a first state, for example, state "0", the input of delay element 211 is connected to the second input of multiplexer 27. When selection signal SEL is in a second state, for example, state "1", the input of delay element 211 is connected to the first input of multiplexer 27, and element 211 then receives drive signal CS5.

Selection signal SEL is generated by logic combination of a logic starting signal, noted ON, with drive signal CSR=CS2. It will be assumed that the oscillator is started when signal ON is in a first state, for example, state "1", and that it is stopped when the signal is in a second state, for example state "0". For this purpose, signals ON and CS2 are provided to the inputs of an AND-type logic gate 29, including two inputs and one output. The first input of gate 29 receives starting signal ON. Its second input receives a logic signal NCS2, generated by inversion of drive signal CS2 in an inverter 30. The output of gate 29 provides selection signal SEL.

The (R+1)-th delay element, that is, element 213, receives drive signal CS2 via a multiplexer 31 including two inputs and one output. Multiplexer 31 receives a logic signal of constant state "1" on its second input, and its output is connected to the input of element 213. It receives logic starting signal ON on a selection input. When selection signal ON is at state "1", the input of delay element 213 is connected to the second input of multiplexer 31. When signal ON is at state "0", the input of element 213 is connected to the first input of multiplexer 31, and this element 213 then receives drive signal CS2.

The illustrated ring oscillator allows generation of signals that are out of phase by a constant time delay, if a given type of edge, here, the rising edges, is considered. Considering a delay element, the propagation time of the rising edges, that is, the delay between the time when a rising edge appears at the input of the element and the time when an induced rising edge appears in the generated drive signal, will be called Tm. The propagation delay of the rising edges, that is, the delay between the time when a falling edge appears at the input of the element and the time when a falling edge appears in the generated drive signal, will be called Td. The delay between the time when a rising edge appears in drive signal CSR and the time when a resulting modification of signal CS1 appears will be called tm. The delay between the time when a failing edge appears in drive signal CSR and the time when a resulting modification of signal CS1 appears will be called td.

The operation of the ring oscillator will now be described, referring to FIGS. 4a to 4g, which respectively show timing diagrams of logic signals ON, SEL, CS1, CS2, CS3, CS4, and CS5. It will be assumed that the drive signals of the delay elements are such that the delays in the different elements are equal.

Assume that ON=0. The ring oscillator is then stopped. Since SEL=0, delay element 211 receives a state "0" on its input. Accordingly, CS1=CS2=0. Further, the input of delay element 213 receives a state "1" and CS3=CS4=CS5=1.

When signal ON switches to state "1", ON=NCS2=1 and signal SEL switches to state "1". Signal CS5, initially at state "1", is issued to the input of the first delay element 211. Since the input state of element 211 is modified, the states of the signals at the input of the following elements will successively be modified. Calling to the time at which the first element receives state "1", signals CS1 and CS2 will switch to state "1" at times (t0+Tm) and (t0+2*Tm). When signal CS2 switches to state "1", NCS2=0 and SEL=0 is obtained. The input of first element 211 will receive a state "0" at time t1=(t0+2*Tm)+tm. Signals CS1 and CS2 will switch to state "0" at time (t1+Td) and (t1+2*Td). The, CS2=0 and at time (t1+2*Td)+td, the input of first element 221 receives signal CS5.

As concerns subset 213–215 of the delay elements, the modification of the state of signal ON will induce a modification of the state of the signal at the input of element 213, which will receive a state "0". The output signals of elements 213, 214, and 215 will thus be modified and will successively switch to state "0". Once signal CS2 switches to state "1", at time (t0+2*Tm), signals CS3, CS4, and CS5 will switch to state "1", so that at time t0+5*Tm, CS5=1 is obtained. It is enough to have SEL=1 when signal CS5 switches to state "1", to generate a rising edge in drive signal CS1 as a result of the rising edge in drive signal CS5.

It can be shown that to generate a continuous oscillation of the output signals, it is enough to choose R such that:

[R*(Tm+Td)+tm+td]<[(N−1)*Tm].

This condition requires that by the time the rising edge which propagates through the assembly of delay elements has reached the output of the n-th delay element, the state at the input of the first delay element is different from the state resulting from the type of edge which propagates (in the present case, this resulting state is state "1").

Preferably, multiplexers will be placed at the inputs of all delay elements, to guarantee equal crossing times for all these elements. In the opposite case, the delay elements including multiplexers at their inputs would withstand higher delays due to the multiplexer crossing time.

It should be noted that outside the starting phase, during which an identity of output states of delay elements placed upstream and downstream of the R-th delay element can be obtained, falling edges which can be equidistant are also generated.

2—Operation of oscillator 6.

Phase-locked circuit 9 according to the present invention is, conversely to a conventional PLL, of digital type. Its operation is based on a sampling of first clock signal CK1, this sampling being driven by drive signals CS1, CS2, . . . , CSN generated by ring oscillator 21.

With respect to a conventional PLL, in which it is desired to accurately locate in time the edges of the received clock signal, these edges can only be located plus or minus the phase difference between the drive signals driving the sampling. In other words, the accuracy of the circuits according to the present invention is lower than that of a conventional PLL, since there is a time uncertainty on the edge position which is equal to the time interval between two samplings. This time interval corresponds to the crossing delay of the delay elements of the ring oscillator.

To ensure a sufficient accuracy of circuit 9, one will not consider the position of the edges of sampled first clock signal CK1 but, on the one hand, the position of the edges driving the sampling of the sampled clock signal and, on the other hand, the state of the sampled signal comparatively to the position of these edges. Indeed, the uncertainty is then no longer given by the phase difference between the drive signals but by the uncertainty of the crossing time of the delay elements of the ring oscillator which generate the drive signals and by the error on the sampling time in the latches. An accuracy on the order of 40 picoseconds (30 picoseconds of uncertainty in the delay elements and 10 picoseconds of error in the latches) will thus be obtained, considering, besides, sampling intervals on the order of one nanosecond.

The operation of the phase-locked circuit of the present invention will now be described.

It will be assumed, to simplify, that the delay elements of ring oscillator 21 are controlled so that a period of sampled clock signal CK1 corresponds to a period of the drive signals generated by ring oscillator 21. For this purpose, considering a two-state logic signal, it is enough for the state of the sampled clock signal to be modified only twice during a cycle of the ring oscillator. An "oscillator cycle" will designate the time period corresponding to the individual frequency of the drive signals. In other words, a second clock signal CSN of same frequency as the frequency of the first clock signal will be generated.

Of course, it should be understood that the frequency of the first clock signal may be divided or multiplied. In the first case, it is enough to sample, in the first clock signal, less than two state modifications per oscillator cycle. In the second case, it is enough to sample more than two state modifications during an oscillator cycle.

Further, the frequency of the first clock signal may be multiplied by combining several drive signals at the circuit output, the drive signals being of frequency lower than or equal to the frequency of the first clock signal. For this purpose, a logic adder such as the logic adder bearing reference 16 which is described in European patent 0441684 could, for example, be used.

In the present invention, it is desired to control ring oscillator 21 so that the state transitions in first clock signal CK1 occur at the border between two sampling intervals and, more specifically, permanently switch between two intervals, around a determined sample.

Assume that at a given time, during an oscillator cycle, a state transition of given type is detected in the first clock signal, between a sample OSi and a sample OSi+1. The detection will be performed in decoding circuit 25. The decoding circuit will not be described in detail, since it raises no problem of implementation, once its functionality has been defined (a VHDL synthesis program automatically defining the implementation of the decoding circuit, in terms of logic gates, based on the desired function, may, for example, be used). Typically, the detection of transitions will be performed by comparing two by two the states of successive samples CSi, CSi+1, i being an index varying from 1 to N−1. If their states are identical, there has been no transition in the time interval separating the sampling of the first clock signal by latches 23i and 23i+1. If their states are different, there has been a transition during this interval. By taking account of the respective states of the compared samples, whether the transition is of rising edge or falling edge type can easily be determined. Once a transition has been detected, a second transition of the same type will be searched in a subsequent oscillator cycle. In the example considered, the oscillator frequency is desired to be substantially equal to that of the first clock signal and the second transition will be searched in the next cycle. If this frequency is desired to be higher, this transition will be searched in a cycle which does not immediately follow the first cycle. Finally, if the oscillator frequency is desired to be lower, other transitions of the same type will be searched in the same cycle.

The implemented method is the following:

if, during the second cycle, a transition is detected in a subsequent interval, for example, between sample OSi+1 and sample OSi+2 (see FIG. 5a), the frequency of the ring oscillator is lower than that of the first clock signal. The period of the ring oscillator is then decreased by controlling said oscillator, to decrease the crossing times of its delay elements;

if a transition is detected in a prior interval, for example, between sample OSi−1 and sample OSi (see FIG. 5b), the ring oscillator frequency is higher than that of the first clock signal. The oscillator period is then increased by controlling an increase of the crossing time of its delay elements;

if a transition is detected in the same interval, that is, between samples OSi and OSi+1 (see FIG. 5c), the period of the ring oscillator is not modified.

In practice, it is desired to position the transitions of the first clock signal between two neighboring intervals, [OSi−1, OSi] and [OSi, OSi+1], or [OSi, OSi+1] and [OSi+1, OSi+2]. In other words, it is desired to obtain a variation of the state of a given sample, at each cycle. By so operating, the uncertainty on the position of the edges in the first clock signal will be equal to the uncertainty on the time when this sample is generated, that is, to the sum of the uncertainty on the crossing delay of the delay elements and of the uncertainty on the sampling time in the latches.

To have a significant accuracy, the modification of the control of the delay elements could be limited to one of the elements, for a given decision of incrementation or decrementation.

Further, this control may be gradually modified, to average its effect, which also increases the accuracy of the circuit according to the present invention. For this purpose, noting dt the minimum increment of the crossing delay of a delay element and the crossing delay of this element being of type (n*dt), one could for example, considering M successive cycles, drive the crossing delay of the controlled element so that it is K*(n*dt) and (M−K)*((n+1)*dt). If the decoding circuit desires to control an increment, then K is replaced with K+1, for example. If the decoding circuit desires a decrement, then K will for example be replaced with K−1. If K=M and an increment is controlled, then the crossing delay of this element is maintained at M*(n+1)*dt and K=1 is applied to the next element of the ring oscillator. If K=1 and a decrement is controlled, then the crossing delay of the element is maintained at M*n*dt, and K=M is applied to the next element of the ring oscillator.

The described method can be shown to be converging. A second clock signal of a frequency stabilized around the desired value is generated, the mean period of the second clock signal being equal to the period of the first clock signal. Further, the jitter in the second clock signal is approximately equal to the uncertainty on the crossing delay of a delay element of the ring oscillator.

If the initial position of the state transitions in the first clock signal is distant from the sample around which it is desired to position these transitions, the described method requires a certain amount of time before converging.

A first solution to overcome this disadvantage is to apply the method to the different samples, so that it is rapidly converged to a stable position. A disadvantage will then be that the equilibrium position will not be determined in advance. In other words, the phase difference between the first and second clock signals will not be accurately controllable. However, if it is desired, in an application, to guarantee a frequency locking, the application of the method to the different samples enables to more rapidly ensure such a locking.

A second solution, to accelerate the converging of the method when distant from the equilibrium position, is to modify the method by more frequently modifying the control of the elements of the ring oscillator. Thus, the control of one of the oscillator elements can be modified at each cycle, instead of modifying it once every M cycles. This could be done when the position of the transitions moves away from the selected sample, by more strongly decrementing or incrementing the crossing delays of the delay elements.

If the first clock signal has a jitter, this jitter may possibly prevent the method from converging to "catch up" on the first clock signal. In this case, the decoding circuit lets the second clock signal drift until the drift of the first clock signal is such that the first signal is synchronized on another sample. In other words, the second clock signal, even though it remains locked in frequency, will be out of phase with respect to the first clock signal. Now, this behavior is inherent to any PLL filtering the jitter of the input signal. A PLL receiving a 100-megahertz input signal, having a jitter of plus or minus 100 picoseconds will, for example, be considered, and the base clock periods will be assumed to be 10.1 nanoseconds during 0.5 microsecond and 99.9 nanoseconds during 0.5 microsecond. If the PLL completely filters the input signal jitter, it will generate an output signal having a period of 10 nanoseconds. If it is assumed that at a given time t0, the signals are in phase, the amount they are out of phase with each other will increase by 100 picoseconds per period until time t0+0.5 microsecond, at which time the signals are 180 degrees out of phase, then it will decrease by 100 picoseconds at each cycle, to cancel at time t0+1 microsecond.

Like a conventional PLL, the circuit according to the present invention filters the high frequency jitter of the first clock signal. However, for a low frequency jitter, that is, a jitter varying slowly in time, then this jitter will not be filtered.

It could be shown that beyond a cut-off frequency depending on the jitter frequency, on the value of the crossing delay of the ring oscillator elements and on the multiplication factor, the jitter at the output of circuit 9 is equal to the crossing delay of a unity element of the oscillator. Beyond this frequency, the output jitter is equal to the input jitter, increased by the intrinsic jitter of the circuit, if the multiplying factor of the frequency is 1. If the multiplying factor is higher than 1, then the input jitter will be divided by the multiplying factor, the intrinsic jitter of the circuit remaining unchanged.

In addition to its improved performance in terms of jitter, the circuit according to the present invention has several advantages:

the surface required to implement the circuit is lower than that of a conventional PLL. Indeed, it requires no analog elements, and more specifically no capacitor, to make an analog filter. Now, analog devices traditionally occupy a larger surface than digital circuits;

the present invention can be implemented in a CMOS-type technology without requiring specific steps of implementation of analog components meant for filtering. The present invention thus has an advantage in terms of manufacturing cost. Further, the present invention will be easily adaptable to different applications. It will be enough to modify the decoding circuit. It can be provided to use a programmable decoding circuit according to the application, which will facilitate the portability of the present invention, or even, in an application, will enable use of a single phase-locked circuit to perform different operations, with no impact on the required surface;

the circuit power consumption is also lower than that of a conventional PLL, of analog type, in which the filter output level is controlled by current sources charging and discharging the filtering capacitor. Since the circuit according to the present invention is of digital type, its power consumption is essentially due to modifications of logic states, which does not generally require a high power consumption.

in the context of an application of high rate series link type, the present invention is particularly advantageous. The use of controllable delay elements used to generate accurately out of phase clock signals is known in this type of application. One could for example refer to European patent 0441684 (and to the US patents mentioned in the present application) which describes such a circuit. A disadvantage of this circuit is that the generation of the out of phase clock signals is directly driven by a base clock signal and that this does not enable filtering of the jitter in the base signal. It is thus necessary for the base clock signal to be generated by an accurate oscillator, made, for example, by using a PLL. The present invention replaces this device with the described oscillator, the phaselocked circuit replacing both the PLL and the circuit generating the out of phase signals. In the circuit according to the present invention, the generation of out of phase clock signals can be combined with the filtering of the jitter in the base clock signal. The occupied surface is thus reduced, this surface having already been further minimized with respect to a conventional PLL. The consumption due to the specific circuit of generation of dephased clock signals is also reduced.

Of course, the present invention is likely to have various alterations, modifications, and improvements which will readily occur to those skilled in the art. Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalents thereto.

What is claimed is:

1. A phase-locked loop circuit, including:

a programmable ring oscillator generating drive signals, an assembly of latches receiving an input signal of the circuit, the latches being driven by the drive signals and generating samples by sampling of the input signal, a logic decoding circuit receiving samples generated by latches and accordingly driving the programmable ring oscillator, wherein the logic decoding circuit includes means for comparing samples two by two to determine whether a state transition has occurred in a time interval separating the two samples, this comparison being performed over at least two cycles, consecutive or not, of the ring oscillator, so that:

if, during the second cycle, a comparable state transition is detected in the same interval, the control of the programmable ring oscillator is not modified, if, during the second cycle, a comparable state transition is detected in a subsequent interval, a decrease of the programmable ring oscillator period is ordered, if, during the second cycle, a comparable state transition is detected in a prior interval, an increase of the programmable ring oscillator period is ordered.

2. The circuit of claim 1, the programmable ring oscillator being formed of an assembly of programmable elements assembled in a loop, wherein the modification of the oscillator control, when an increase or a decrease of its period is ordered, is performed on one of the programmable elements of the oscillator.

3. The circuit of claim 1, wherein the control of the programmable ring oscillator is gradually modified, by increasing and/or decreasing its period once every M periods, with M being an integer.

4. The circuit of claim 1, wherein the programmable ring oscillator is formed of programmable delay elements assembled in a loop.

5. The circuit of claim 4, wherein the delay elements are non-inverting and the programmable ring oscillator includes means for modifying the state of an input signal of the first delay element, to enable an oscillation of all delay elements.

6. The circuit of claim 5, wherein the programmable ring oscillator includes multiplexing means arranged so that an input of the first delay element is connected to an output of the last element or receives a permanent logic state, the multiplexing means being controlled by a drive signal generated on an output of one of the delay elements.

7. The circuit of claim 1, wherein the drive signals are combined in a logic adder to generate an output signal of a frequency multiple of the frequency of the programmable ring oscillator.

* * * * *